(12) United States Patent
Koenig et al.

(10) Patent No.: US 8,434,052 B1
(45) Date of Patent: Apr. 30, 2013

(54) SYSTEM AND METHOD FOR ENSURING PARTITIONED BLOCK PHYSICAL COMPATIBILITY BETWEEN REVISIONS OF AN INTEGRATED CIRCUIT DESIGN

(75) Inventors: Brady A. Koenig, Fort Collins, CO (US); Richard S. Rodgers, Fort Collins, CO (US); Jason T. Gentry, Windsor, CO (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 0 days.

(21) Appl. No.: 13/401,624

(22) Filed: Feb. 21, 2012

(51) Int. Cl.
 *G06F 17/50* (2006.01)
(52) U.S. Cl.
 USPC ........... 716/139; 716/107; 716/118; 716/119; 716/123
(58) Field of Classification Search .................. 716/107, 716/118, 119, 123, 139
 See application file for complete search history.

(56) References Cited

U.S. PATENT DOCUMENTS

| | | | | |
|---|---|---|---|---|
| 5,448,496 A | * | 9/1995 | Butts et al. | 716/116 |
| 5,649,165 A | * | 7/1997 | Jain et al. | 716/106 |
| 6,530,073 B2 | * | 3/2003 | Morgan | 716/102 |
| 6,567,957 B1 | | 5/2003 | Chang et al. | |
| 7,117,459 B2 | * | 10/2006 | Tanimoto et al. | 716/112 |
| 7,284,214 B2 | * | 10/2007 | LeBritton et al. | 716/52 |
| 7,730,437 B1 | | 6/2010 | Ramakrishnan et al. | |
| 8,019,585 B2 | * | 9/2011 | Rahman et al. | 703/14 |
| 8,042,078 B2 | * | 10/2011 | Paruthi et al. | 716/106 |
| 8,191,034 B1 | * | 5/2012 | Mohan | 716/136 |
| 2002/0059553 A1 | | 5/2002 | Eng | |
| 2006/0030965 A1 | * | 2/2006 | Williams et al. | 700/121 |
| 2007/0220461 A1 | * | 9/2007 | Baumgartner et al. | 716/5 |
| 2011/0214096 A1 | * | 9/2011 | Sheeley et al. | 716/107 |

FOREIGN PATENT DOCUMENTS

WO 2007080184 7/2007

OTHER PUBLICATIONS

J.M. Ludden, et al., "Functional verification of the POWER4 microprocessor and POWER4 multiprocessor systems," IBM Journal of Research and Development, vol. 46, No. 1, pp. 53-76, Jan. 2002.

* cited by examiner

*Primary Examiner* — Naum Levin

(57) ABSTRACT

Differences between block interfaces of a partitioned logic block in two floorplans of an integrated circuit can be determined by comparing an image of pins of a partitioned logic block in a first floorplan of the integrated circuit with an image of pins of the partitioned logic block in a second floorplan of the integrated circuit. The second floorplan can represent a new floorplan design resulting from a change to an integrated circuit design represented by the first floorplan. If no differences exist between pins of the partitioned logic block in the first and second floorplans, information representing the partitioned logic block in the second floorplan can be substituted with information representing the partitioned logic block in the first floorplan.

18 Claims, 5 Drawing Sheets

SYSTEM AND METHOD FOR ENSURING PARTITIONED BLOCK PHYSICAL COMPATIBILITY BETWEEN REVISIONS OF AN INTEGRATED CIRCUIT DESIGN

BACKGROUND

The process of creating an application-specific integrated circuit (ASIC) is commonly described in terms of a sequence of stages. In a commercial business setting in which ASICs are designed, stages commonly overlap each other in time, with different groups of design personnel simultaneously performing different tasks relating to the same end-product ASIC. The stages are known by various names but commonly include activities along the following lines.

At an early stage in the process, design personnel generate a description of the ASIC either in a hardware description language (HDL) or in a graphical schematic diagram form. An HDL description is commonly referred to as a register transfer level (RTL) design. This stage is followed by a stage in which simulations or other tests are performed upon the RTL design to verify that it performs the functions the designers intended. A later stage follows in which the RTL design is compiled or transformed into a netlist. A netlist is a collection of constructs commonly referred to as standard logic cells along with the interconnections between them. An ASIC fabricator commonly provides the designers with a library of standard logic cells that the ASIC fabricator has proven capable of transforming into physical structures on a semiconductor chip. Standard logic cells are commonly grouped or partitioned into "blocks." For example, a complete memory subsystem might be designated as a block. Then, in a stage commonly referred to as "placement," the standard logic cells or blocks are assigned locations on a region representing the chip.

The term "floorplan" is commonly used to refer to a tentative placement or arrangement of logic cells or partitioned blocks. In a related stage, commonly referred to as "routing," locations on the chip for the signal paths that interconnect the blocks or cells are assigned. The logic of each block may be individually placed and routed, independently of the other blocks. In addition, at the top-level of the chip design, the blocks may be placed and the interconnections between them routed.

The result of the routing stage is a data file or database that includes the information needed by the fabricator to fabricate or produce the actual semiconductor chip. The information represents the photolithographic masks that are used in the fabrication process. However, additional verification, analysis and optimization stages are commonly performed prior to finalizing the data file and fabricating the chip.

Each of the above-described stages involves the use of one or more automated design tools, i.e., computer software. For example, a floorplanning tool commonly receives as its input a netlist describing all of the blocks, the standard logic cells within the blocks, and their interconnections. A person can use the floorplanning tool to place or arrange the blocks at locations within the region representing the chip, setting aside spaces to accommodate the interconnects between blocks in a top-level routing stage. The data set that represents the output of a tool used in one stage commonly represents the input of another tool used in the next stage.

A chip design is hierarchical in the sense that it consists of a block-level design or data set describing each block as well as a top-level design or data set for the chip as a whole that describes the locations of the blocks and the interconnections between blocks. The set of block designs plus the top-level design in accordance with the floorplan is reflected in what is sometimes referred to as a full-chip data set or database. The final stage in the process of designing each block involves verifying that the design functions in the intended manner. The final stage in the process of designing the chip as a whole, after the stage in which all blocks have been placed, involves a top-level verification of the functionality of the chip. Verification tools exist for these purposes.

As in any design process, design personnel may desire to make changes to the chip design after it has been completed or at some point during the design process. Changes made later in the design process have a greater potential to delay completion of the chip design project because a change in one aspect of the chip has the potential to impact other aspects of the chip. The potential for delaying the design project arises because it is often difficult to determine how a change in one aspect of the chip might impact other aspects of the chip. For example, a change that design personnel may make to one block or to interconnections between blocks has the potential to lead the automated design tool involved in a later or related stage of the overall design process to automatically change some other aspect of the design, such as power distribution interconnections, clock signal distribution interconnections, ports (i.e., the boundaries defining signal inputs and outputs of blocks), top-level feed-throughs (i.e., interconnections that pass signals around a block), or other aspects. For example, even a change that is wholly within a block has the potential to affect the top-level interconnection routing if the change increases the size of the block to an extent that interconnections must be rerouted or moved. Such changes generally imply a change in the floorplan.

A change in one aspect of the chip design has the potential to impact other aspects of the chip design to an extent severe enough that the result of the above-referenced top-level verification stage may be that the verification fails. A failure of the design to verify at the top level means that a chip reflecting that design may not perform as intended if it were fabricated. At least two alternative methods are known for handling this potential problem.

A first method is to perform all of the above-referenced stages of the design process again, substituting the changed item (e.g., block, interconnection, port, etc.) for that of the original design. The netlist is then input to the floorplanning tool, which processes the netlist and outputs a new floorplan data set. The floorplan may be partitioned into blocks. The blocks are then provided as input to the block-level place-and-route tool and the top-level place-and-route tool, even though many of the blocks may be unchanged. It can be noted that many of the partitioned blocks may be identical to the blocks in the original design if the change affected only a small number of blocks. Then, the output of the place-and-route tool is input to the full-chip verification tool, which verifies the chip design as a whole. As all of the stages of the process have been performed again, there is no inherent reason why the top-level verification should fail if it such verification of the original design (i.e., before the change was made) previously passed. This first method is thus a conservative approach. The drawback of this approach, however, is the delay caused by re-doing all of the steps and sub-steps of the design process. The later in the design process, i.e., the more blocks that have already been completed at the time of the change, the greater the potential delay to the chip design project as a whole.

A second, less conservative, method is to simply substitute the changed item for the original item in the overall chip design and proceed directly to the full-chip verification stage. If the full chip design passes verification, the design can proceed to fabrication. But if the full-chip verification fails, then design personnel must generally re-do all of the steps as in the first method. Thus, this second method risks delaying the chip design project even more.

Experienced chip design personnel often can correctly predict whether a change in one aspect of a chip design is likely to impact other aspects to an extent that the top-level verification would fail. A change that is made wholly within a block often has no significant impact on other blocks, interconnections between blocks, ports, or other aspects of the chip design. However, there is no known method by which such predictions can be rigorously tested.

SUMMARY

Embodiments of the invention relate to a system, method and computer program product for determining differences between block interfaces of a partitioned logic block in two floorplans of an integrated circuit. In an exemplary embodiment, a computer system (or portion thereof) is provided with first information representing an image of pins of the partitioned logic block in a first floorplan of the integrated circuit. The computer system is also provided with second information representing an image of pins of the partitioned logic block in a second floorplan of the integrated circuit. The computer system compares the first information with the second information to determine differences between locations of the pins of the partitioned logic block in the first floorplan and the locations of the pins of the partitioned logic block in the second floorplan. If it is determined that no such differences exist, the computer system substitutes information representing the partitioned logic block in the second floorplan with information representing the partitioned logic block in the first floorplan.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Also, like elements are indicated by like reference numerals in the following drawings.

DETAILED DESCRIPTION

Figure 1:
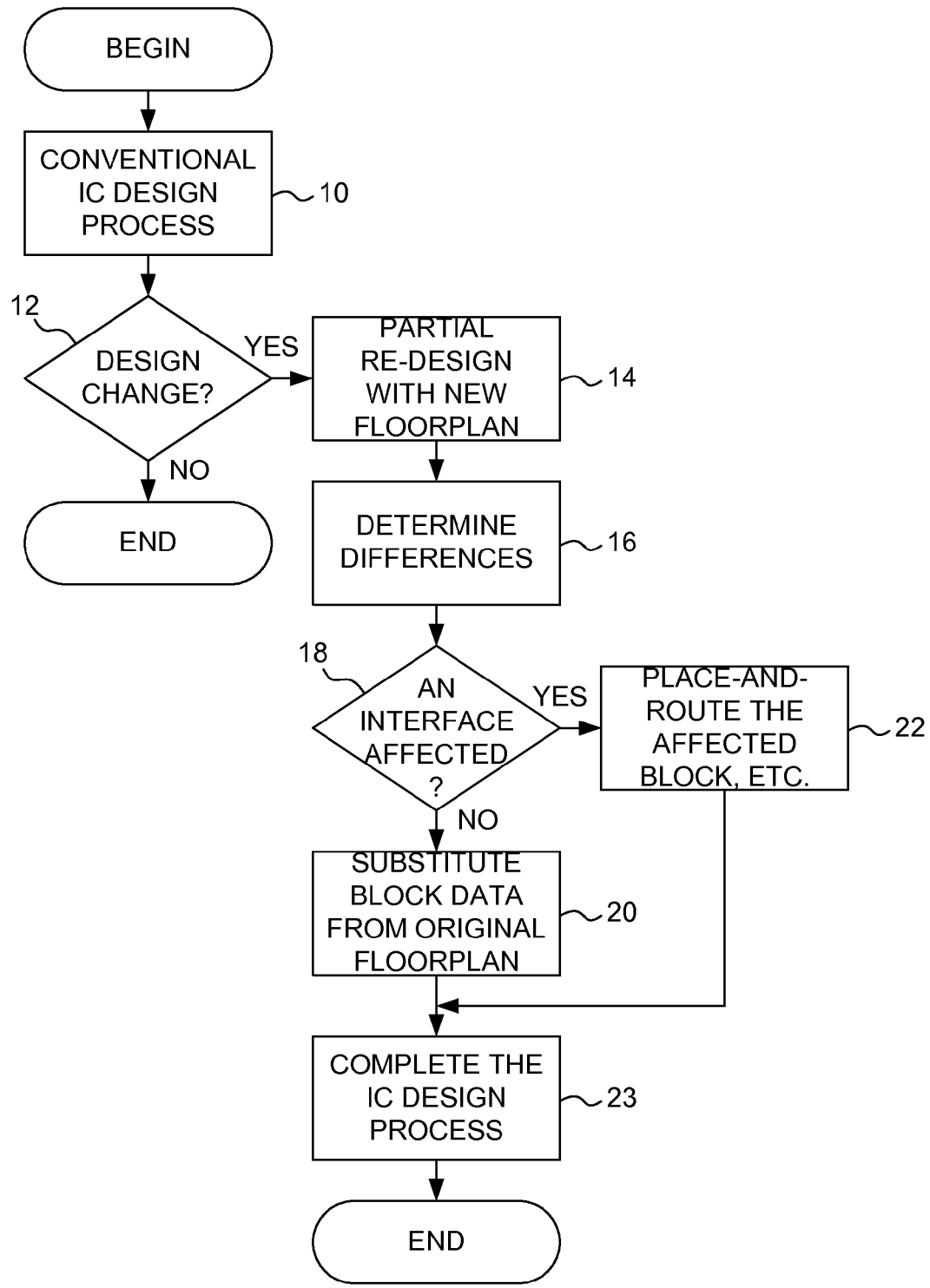
FIG. 1 is a flow diagram illustrating an exemplary method for determining differences between block interfaces of a partitioned logic block in two floorplans of an integrated circuit, in accordance with an exemplary embodiment of the present invention.

In an illustrative or exemplary embodiment of the invention, a method for determining differences between block interfaces of a partitioned logic block in two floorplans of an integrated circuit can be described with regard to FIG. 1. The exemplary method begins with a conventional integrated circuit (IC) design process, indicated by block 10, which is described in further detail below. If, as indicated by block 12, it is desired to make a design change to the IC design resulting from the process of block 10, then a partial re-design of that IC design is made, as indicated by block 14. Note that the re-design involves a new or second floorplan. The new or second floorplan may or may not differ in substance from the first or original floorplan that characterized the original IC design, i.e., the IC design prior to making the design change. Nevertheless, the new or second floorplan is represented by a data set (also referred to in the art as a chip database) that is distinct from the data set that represents the original or first floorplan, because each data set is the output or result produced by a floorplanning tool (not shown) in response to an input netlist. The partial re-design is thus defined in part by a new or second netlist and a new or second floorplan.

As indicated by block 16, differences at the interface between a partitioned logic block of the IC design and the top-level of the IC design are determined. The manner in which such differences are determined is described in further detail below. In accordance with the present invention, and as indicated by blocks 18 and 20, it has been recognized that if the design change causes no change in the interface between a partitioned logic block of the IC design and the top-level of the IC design, then the logic block in the first or original IC design under the first or original floorplan can be used in the new or second IC design under the second or new floorplan. That is, information representing the partitioned logic block in the second floorplan can be substituted with information representing the partitioned logic block in the first floorplan. However, as indicated by block 22, if the design change causes a change in the interface between the partitioned logic block of the IC design and the top-level of the IC design, then the affected logic block in the second floorplan is retained, and a process of placing the logic elements in that logic block and routing the signals among them is performed before this logic block that has been affected by the design change is incorporated into the IC design as a whole. Block 23 indicates additional steps that are performed to complete the IC design process, as described in further detail below.

Figure 2A:
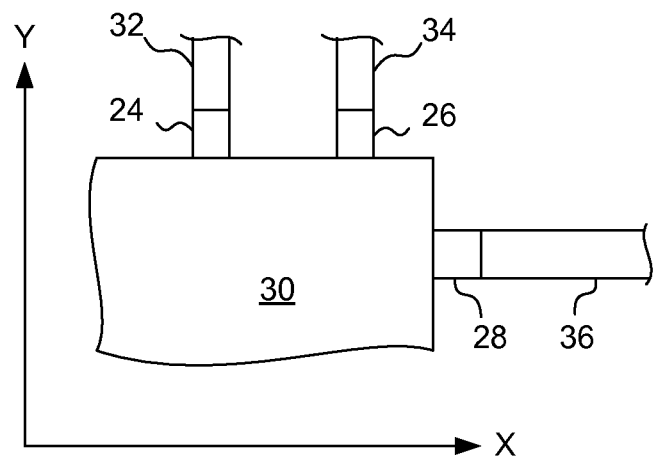
FIG. 2A is a conceptual illustration of an exemplary top-level interface before an exemplary design change.
Figure 2B:
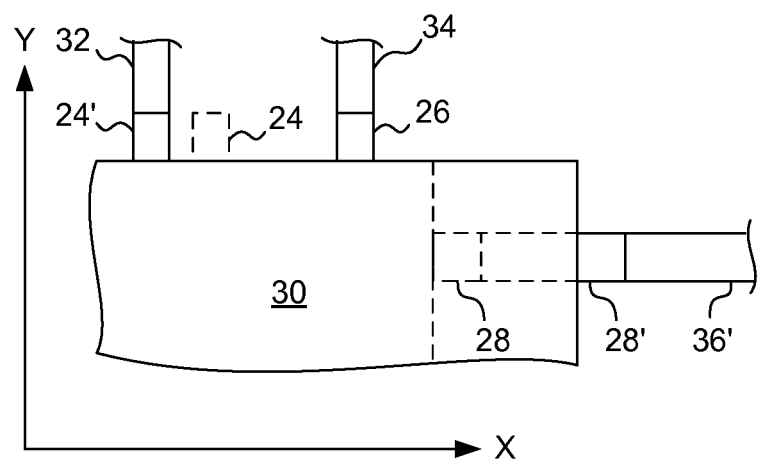
FIG. 2B is a conceptual illustration of the top-level interface of FIG. 2A, showing an example of a change in the interface caused by the design change.

As well understood by persons skilled in the art, the term "interface" as used above refers to metalized regions that conduct signals between the logic elements internal to a logic block of an IC and the ("top-level") metalized regions that conduct signals between logic blocks of the IC. As illustrated in FIGS. 2A-B, such an interface is commonly described in the art as comprising a number of "pins" (e.g., pins 24, 26, 28, etc.), where a pin is a metalized region typically having a rectangular shape. In the exemplary interface arrangement shown in FIG. 2, pin 24 interfaces the exemplary partitioned logic block 30 with a top-level metalized region 32; pin 26 interfaces the exemplary partitioned logic block 30 with a top-level metalized region 34; and pin 28 interfaces the exemplary partitioned logic block 30 with a top-level metalized region 36.

Some examples of differences at the interface between a partitioned logic block of the IC design and the top-level of the IC design are indicated by broken line in FIG. 2B. That is, exemplary pins 24, 26 and 28 are shown in FIG. 2A as those pins exist in the IC design under the original or first floorplan, exemplary pins 24', 26 and 28' are shown in FIG. 2B as those pins exist in the IC design under the new or second floorplan. In FIG. 2B, it can be observed that the design change caused pins 24 and 28 to change location (with respect to an X-Y coordinate system). (The change in location is indicated by the "prime" symbol in the reference numerals of the relocated elements.) It can also be observed in FIG. 2B that the size of IC 30 has increased in the X-axis dimension as a result of the design change, thereby relocating pin 28 to the new edge of partitioned logic block 30, as indicated by relocated pin 28'. Many other examples of design changes that can affect the locations or dimensions of pins of partitioned blocks will occur readily to persons skilled in the art. It should be noted that FIGS. 2A-B represent only a small portion of a single layer in the IC design, and that a typical IC design includes many layers.

Figure 3A:
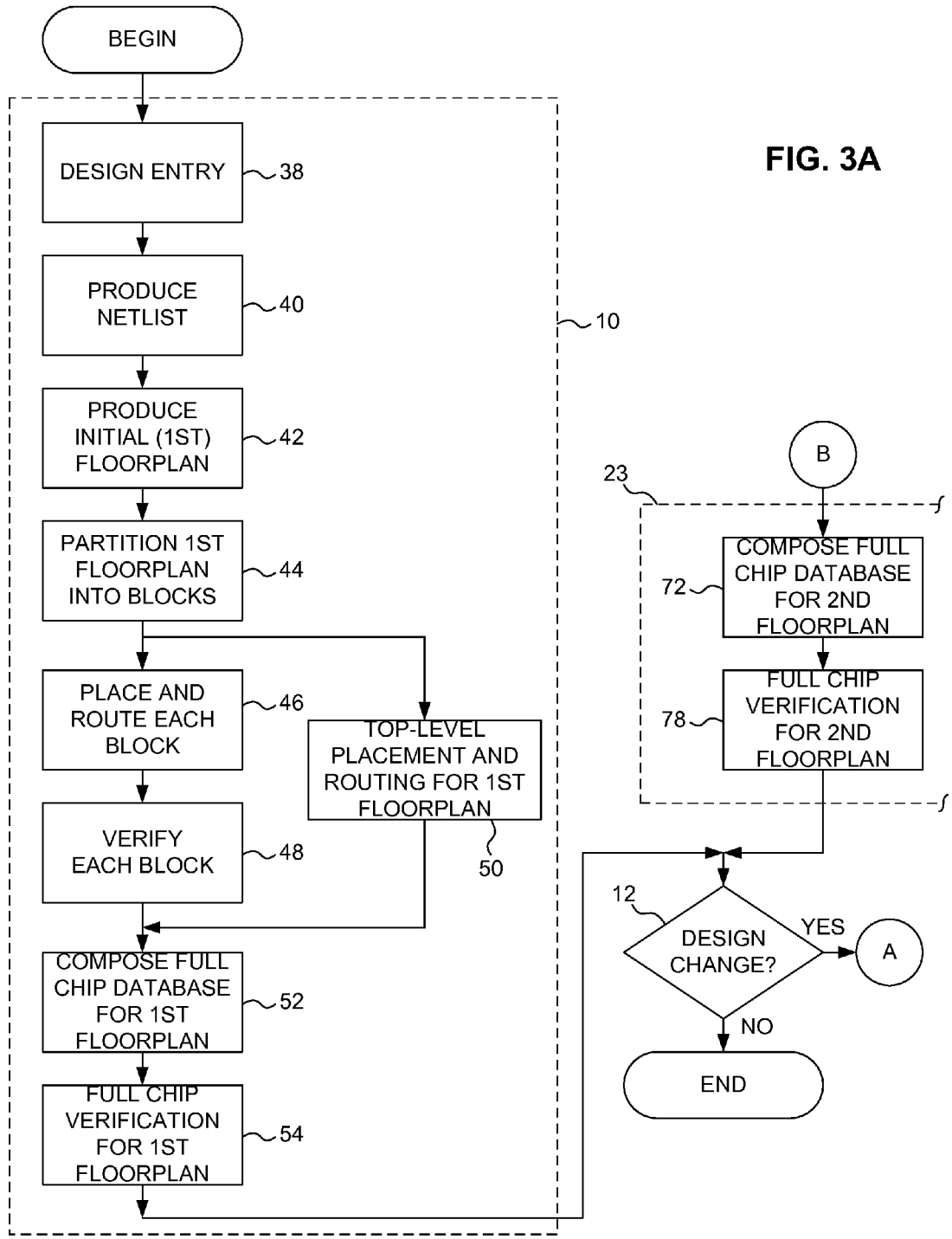
FIG. 3A is a flow diagram showing portions of FIG. 1 in further detail.
Figure 3B:
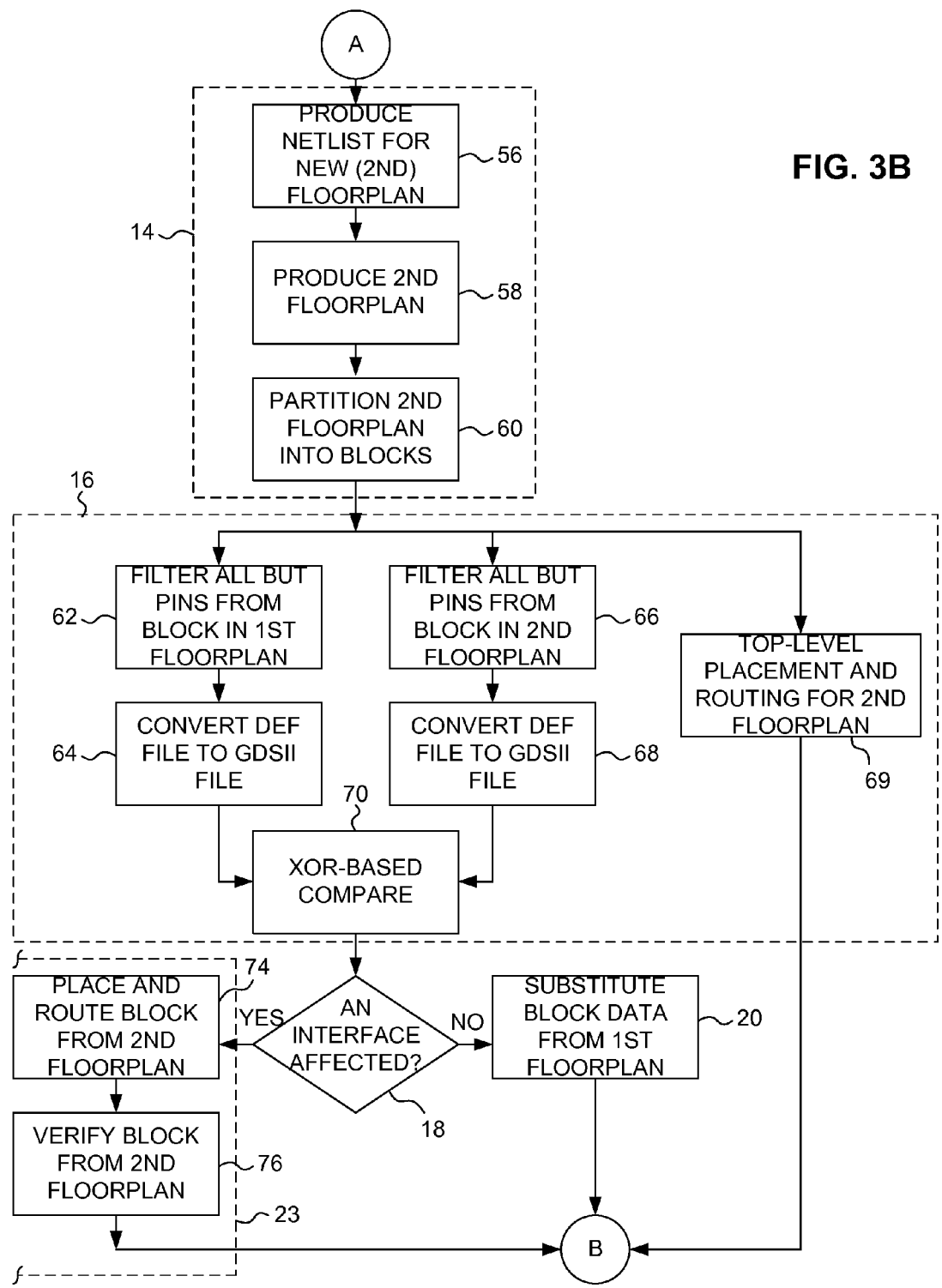
FIG. 3B is a continuation of the flow diagram of FIG. 2A.

The method described above with regard to FIG. 1 can be described in further detail with regard to FIGS. 3A-B. The conventional design process indicated by block 10 in FIG. 1 can include the following operations. As indicated by block 38 in FIG. 3A, a design-entry system can be employed to produce a design in a hardware description language (HDL) or in schematic diagram form. As indicated by block 40, the same or a related system can compile or synthesize the output of the design-entry system into a netlist (data file). As indicated by block 42, a floorplanning system can be used to produce an initial or first floorplan from the netlist. As indicated by block 44, the same or a related system can be used to partition the floorplan into partitioned logic blocks. A partitioned block is a hierarchical sub-divided portion of the chip design. As persons skilled in the art are familiar with the characteristics of partitioned blocks, partitioned blocks are not described in further detail herein.

As indicated by block 46, a place-and-route system can be used to place the logic elements within each block and route the interconnections between the logic elements. Block 48 indicates that each partitioned logic block that is generated in this manner can be verified by inputting a data file representing the partitioned logic block to a verification system. Similarly, as indicated by block 50, a place-and-route system can be used to place the partitioned logic blocks within the top-level floorplan and route the interconnections between the partitioned logic blocks.

As indicated by block 52, a full-chip place-and-route engine or tool can be used to compose a full-chip data set or database. The information in this full-chip data set represents the design or structure of the IC in accordance with the floorplan. The information may be, for example, in formats such as a combination of Design Exchange Format (DEF) and Library Exchange Format (LEF). As well known in the art, DEF is a specification for representing the physical layout of an IC in an ASCII format. A DEF file represents the netlist and circuit layout, i.e., arrangement of the logic blocks. As likewise well known in the art, LEF is a specification for representing the routing design rules as well as the abstract of the standard cells. The term "abstract" in this context refers to the absence of information describing the internal netlist of a cell. A LEF file contains information about, among other things, the dimensions of standard cells and the layout of their pins. As indicated by block 54, the full-chip design can be verified by inputting this data set to a verification system.

As known in the art, various software packages or tools for effecting the above-described operations are widely commercially available from a variety of sources. Accordingly, the manner in which one or more computer systems are configured with such software packages and used in the manner of the design-entry, floorplanning, place-and-route and verification systems described above is well understood by persons skilled in the art and therefore not described in further detail herein.

Following the conventional design process described above, the resulting full-chip data set can be provided to an IC fabricator or foundry for producing photolithographic masks in accordance with the data set and, in turn, producing semiconductor chips in accordance with the masks. However, as described above with regard to block 12 in FIG. 1, it may instead be desired to make a change in some aspect of the IC design following the conventional design process described above but before proceeding to the fabrication stage.

If, as indicated by block 12, a design change is to be made, then the re-design process indicated by block 14 can include the following operations as shown in FIG. 3B. As indicated by block 56, the above-referenced design-entry system can be used to make the change in the original HDL or schematic diagram and compile the revised design into a new or second netlist (data file). As indicated by block 58, the above-referenced floorplanning system can be used to produce a new or second floorplan from the new or second netlist. Block 58 thus represents the same operation as block 42 described above. As indicated by block 60, the same or a related system can be used to partition the second floorplan into partitioned logic blocks. Block 60 thus represents the same operation as block 44 described above.

Some of the partitioned logic blocks in the original or first floorplan may be usable in the new or second floorplan because their interfaces are unchanged as a result of the design change. That is, it is not necessary to place and route any such partitioned logic blocks whose interfaces are unaffected by the design change. Rather, the portions of the data set in the second floorplan representing an unaffected logic block can simply be substituted with the data representing the same logic block in the first floorplan.

The method or process indicated by block 16 in FIG. 1, in which it is determined whether the interface of a partitioned logic block has been affected by the design change, can include the following operations. The method determines differences between locations of the pins of a partitioned logic block in the first floorplan and the locations of the pins of a partitioned logic block in the second floorplan. Note that although block 16 relates to processing only a single partitioned logic block for purposes of clarity, the same processing method can be repeated for each partitioned logic block in the first floorplan for which it is desired to determine whether that block is substitutable in the second floorplan To determine differences between the interface of the partitioned logic block in the first floorplan and the same partitioned logic block in the second floorplan, an image of the pins of the partitioned logic block in the first floorplan is compared with an image of the pins of the partitioned logic block in the second floorplan.

As indicated by block 62, in the exemplary embodiment the data set or file that is output by the above-described partial re-design process (block 14) can be filtered to remove all data from the partitioned logic block in the first floorplan except the data that describes the pins. The resulting data set or file can be converted to an image format, as indicated by block 64. Similarly, as indicated by block 66, in the exemplary embodiment the data set or file that is output by the above-described partial re-design process (block 14) can be filtered to remove all data from the partitioned logic block in the second floorplan except the data that describes the pins. Alternatively, the data set or file representing the partitioned logic block in the second floorplan can be parsed to extract into a new data file only the data that describes the pins. The resulting data set or file can be converted to an image format, as indicated by block 68.

As indicated by block 69, the place-and-route system can place the partitioned logic blocks within the second floorplan and route the interconnections between them, i.e., top-level placement and routing occurs. Note that blocks 62 and 64 represent operations that can be performed essentially in parallel or independently of the operations represented by blocks 66 and 68. Likewise, block 69 represents an operation that can be performed essentially in parallel or independently of the operations represented by blocks 62, 64, 66 and 68.

As an example of the conversion represented by blocks 64 and 68, in an embodiment in which the output of the partial re-design process (block 14) is in DEF the data set can be converted to an image format such as that which is commonly known as Graphic Database System II (GDSII). GDSII is a format commonly used to convey photolithographic mask layouts (known as "artwork") from an IC designer to the IC fabricator (foundry). GDSII has a binary format defining a hierarchy of planar geometric shapes (i.e., polygons) and other elements. Objects in a GDSII file are assigned attributes including the mask layer on which the object appears. As GDSII is a polygon-based graphics or image format, the data identifies polygon coordinates, and the polygons represent regions that are to be metalized on the semiconductor substrate, such as signal lines and vias, when the IC chip is fabricated. Although in the exemplary embodiment the DEF format and GDSII format are contemplated, in other embodiments any other suitable format or formats can be used.

Also, in an embodiment in which the output of the partial re-design process (block 14) is already itself an image file, the conversion indicated by blocks 64 and 68 is omitted. Also, with regard to blocks 62 and 66, in other embodiments, instead of filtering out all data except the data that represents the pins, the data set or file can be parsed to extract into a new data file only the data that describes the pins. Alternatively, in still other embodiments the data set can be processed in a manner that detects and operates upon the pins and ignores all other data in the data set or file.

As indicated by block 70, an exclusive-OR operation is performed between the data set representing an image of pins of the partitioned logic block in the first floorplan (e.g., the image data produced by the conversion described above with regard to block 64) and the data set representing an image of pins of the partitioned logic block in the second floorplan (e.g., the image data produced by the conversion described above with regard to block 64). Although in the exemplary embodiment an exclusive-OR operation is used to determine differences between the two images, in other embodiments any other suitable method can be used.

In an instance in which the image of pins of the partitioned logic block in the first floorplan is identical to the image of pins of the partitioned logic block in the second floorplan, the result of the exclusive-OR operation will be zero or a null value. Such a zero or null value indicates that the design change did not cause any change in the interface of the partitioned data block at issue. Any value other than zero or null indicates that the design change caused a change in the interface of the partitioned data block at issue. Block 18 in FIG. 3B indicates a decision based the result of the exclusive-OR operation.

If the result of the exclusive-OR operation indicates that the design change caused no change to the interface (pins) of the partitioned logic block at issue, then the data or information representing the partitioned logic block in the second floorplan is substituted with data or information representing the partitioned logic block in the first floorplan, as indicated by block 20. That is, the partitioned logic block as it is represented by data in accordance with the first floorplan is used in the second floorplan. Any data structure representing that partitioned logic block in the second floorplan data set can be immediately substituted with the data representing the partitioned logic block in the first floorplan; there is no need to perform placing and routing upon the data representing the partitioned logic block in the first floorplan, since such placing and routing has already been performed (block 46). The process then continues as described below with regard to block 72 (FIG. 3A).

If the result of the exclusive-OR operation indicates that the design change caused a change to the interface (pins) of the partitioned block at issue, then the data representing the partitioned logic block in the second floorplan is placed and routed, as indicated by block 74. That is, the data representing the partitioned logic block in the second floorplan is input to the place-and-route system described above with regard to block 46. As indicated by block 76, a verification process can be performed on the data representing the partitioned data block following the place-and-route process in the same manner described above with regard to block 48. The process then continues with block 72 (FIG. 3A).

As indicated by block 72, a full-chip data set or database is composed for the second floorplan using a full-chip place-and-route engine or tool in the same manner described above with regard to block 52. The result is one or more chip-level data files in, for example, GDSII format. During this chip-level data file generation process, the GDSII data file created for each partitioned block during the block-level place-and-route process is substituted for the corresponding block abstract (LEF) in the second floorplan. As indicated by block 78, a verification process can be performed on the data representing the full-chip data set in the same manner described above with regard to block 54. Following verification of the full-chip data set, the method for determining differences between partitioned logic block interfaces of a partitioned logic block in two floorplans of an IC is effectively completed. If another design change is desired, the method can proceed again as described above with regard to block 12.

The exemplary method described above can be performed in the sequence of operations described above or, in other embodiments, any other suitable sequence. In other embodiments the method can include additional operations or fewer operations.

Figure 4:
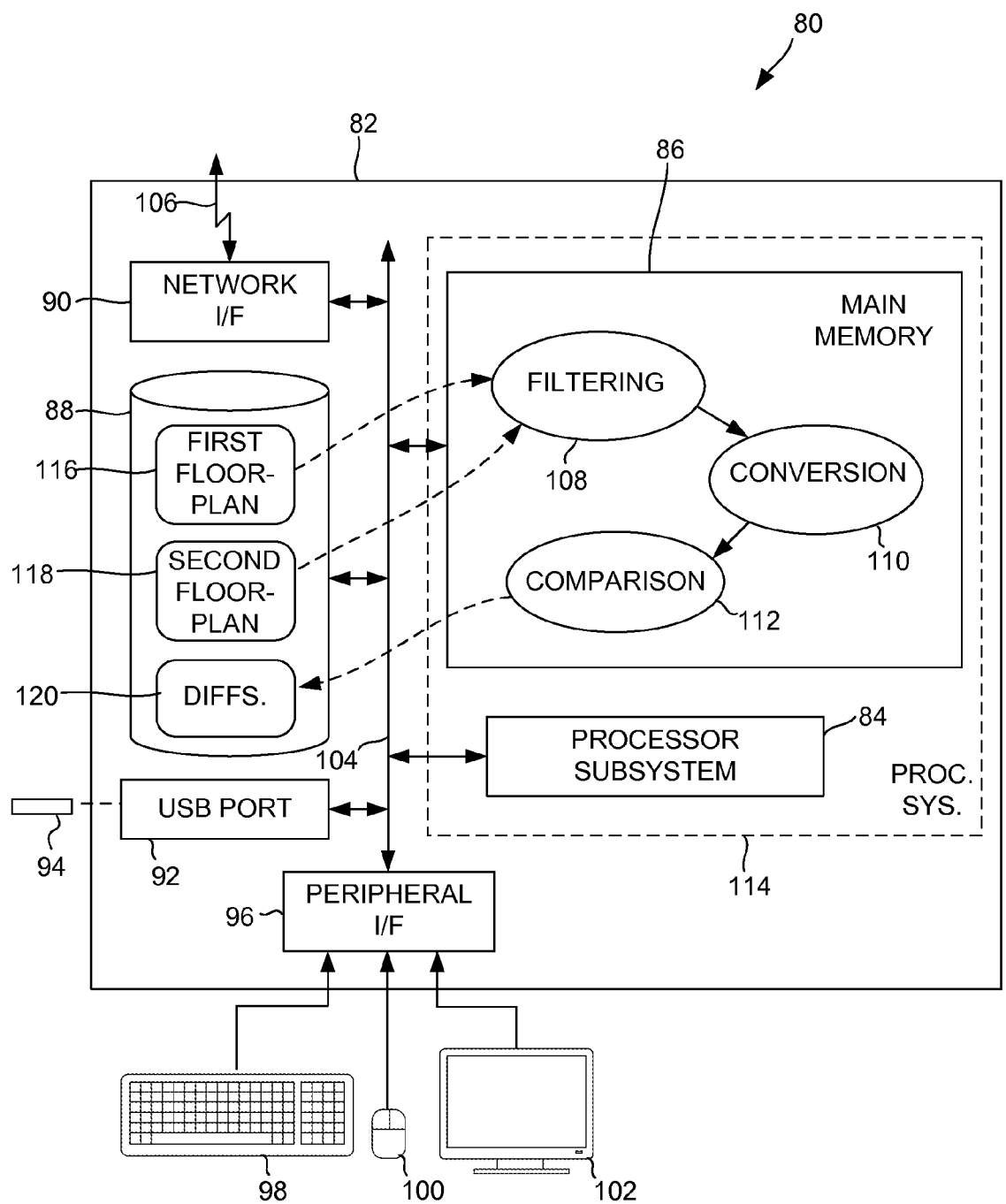
FIG. 4 is a block diagram of an exemplary computer system that is programmed or configured to determine differences between block interfaces of a partitioned logic block in two floorplans of an integrated circuit, in accordance with an exemplary embodiment of the present invention.

As illustrated in FIG. 4, an exemplary system 80 for determining differences between partitioned logic block interfaces of a partitioned logic block in two floorplans of an IC includes a computer system 82. In the exemplary embodiment, computer system 82 essentially can be a workstation or personal computer system that has been suitably programmed or otherwise configured, as described below. Computer system 82 can be, for example, any computer system of a type commonly used in a conventional ASIC design process. But for the software elements described below, computer system 82 can have a conventional structure and configuration. Accordingly, computer system 82 includes hardware and software elements of the types commonly included in such computer systems, such as a processor subsystem 84, a memory subsystem 86, non-volatile data storage 88 (e.g., a hard disk drive, FLASH memory, etc.), a network interface 90, and one or more ports 92 for reading from and writing to external devices. Such external devices can include a removable data storage medium 94, such as a Universal Serial Bus (USB)

"thumb drive." Computer system 82 also includes a peripheral interface 96 through which data communication with a keyboard 98, mouse 100 and display 102 can occur. Peripheral interface 96 can comprise USB ports of the same type as port 92 or any other suitable type of ports. In other embodiments, computer system 82 can include hardware and software elements in addition to those described herein or that are different from those described herein. The above-described elements can communicate with one another via a digital bus 104. Computer system 82 can communicate with remote devices (not shown) via a network connection 106, such as a connection to the Internet.

Memory subsystem 86 is generally of a type in which software elements, such as data and programming code, are operated upon by processor subsystem 84. In accordance with conventional computing principles, processor subsystem 84 operates in accordance with programming code, such as operating system code and application program code. In the exemplary embodiment of the invention, such application program code can include the following software elements: a filtering element 108, a conversion element 110, and an exclusive-OR or similar comparison element 112. Although these software elements are conceptually shown for purposes of illustration as stored or residing in memory subsystem 86, persons skilled in the art to which the invention relates can appreciate that such software elements may not reside simultaneously or in their entireties in memory subsystem 86 but rather may be retrieved in portions on an as-needed basis, e.g., in code segments, files, modules, objects, data structures, instruction-by-instruction, or any other suitable basis, from data storage 88 or other suitable source (e.g., via network connection 106).

Note that although only filtering element 108, conversion element 110, and comparison element 112 are shown for purposes of clarity, other software elements of the types conventionally included in computers systems that enable them to operate properly are generally included, such as operating system software. In addition, software elements of the types described above, such as design entry software, place-and-route software, block partitioning software, full-chip composition software, and verification software can be included. However, it should be recognized that, as multiple persons are commonly involved in the process of designing an ASIC in a commercial setting, and as each person or team of design personnel may use a different computer system from the others, such design entry software, place-and-route software, block partitioning software, full-chip composition software, and verification software may be included in a computer (not shown) other than computer system 82 or distributed among several computers. Accordingly, conventional software, such as design entry software, block-level place-and-route software, block partitioning software, full-chip place-and-route (composition) software, and verification software are not shown in FIG. 4 for purposes of clarity.

It should be noted that, as programmed or otherwise configured in accordance with the above-described software elements, the combination of processor subsystem 84, memory subsystem 86 (or other element or elements in which software is stored or resides) and any related elements generally defines a programmed processor system 114 to which the other elements of computer system 82 are peripheral. It should also be noted that the combination of software elements and the non-transitory medium on which they are stored or in which they reside (e.g., memory subsystem 86, data storage 88, removable data storage medium 94, etc.) generally constitutes what is referred to in the patent lexicon as a "computer program product."

In the exemplary embodiment, a computer-implemented method for determining differences between partitioned logic block interfaces of a partitioned logic block in two floorplans of an IC can be initiated by a person (user) who operates computer system 82. A user can operate computer system 82 locally using keyboard 98, mouse 100, display 102, etc., or remotely via network connection 106. In operation, and in accordance with the effects of software elements that can include filtering element 108, conversion element 110, and comparison element 112, computer system 82 can provide a suitable user interface through which the user can interact with computer system 82. Although such a user interface is not described herein in further detail, it should be noted that in the exemplary embodiment a user can control computer system 82 in a manner that causes computer system 82 to obtain data sets (data files, databases, etc.) from, for example, data storage 88, effect the methods described above, and produce output data (data sets, data files, databases, etc.).

It is contemplated that one or more of the operations described above with regard to the flow diagrams illustrated in FIG. 1 and FIGS. 3A-B may occur in response to user input, e.g., at the initiation of a user or in response to data entered or loaded by a user. Nevertheless, operations may be automated to any suitable extent. That is, operations may occur in response to any suitable degree of user input, including no user input in the case of operations that do not require user input. Regardless of the extent to which user input may be involved in an embodiment, it can be noted that in the exemplary embodiment the method for determining differences between partitioned logic block interfaces in two floorplans of an IC is effected through the operation of computer system 82 and, more generally, programmed processor system 114. Also, although for purposes of clarity the operations are described above as occurring in an exemplary sequence in association with computer system 82, persons skilled in the art appreciate that in other embodiments the various operations can occur at different times, in different places, and in response to input provided by different persons using different computers or other systems.

Except where indicated otherwise, the input data for each operation described above with regard to the flow diagram of FIGS. 3A-B is the output data produced by an operation preceding that operation in the exemplary sequence of operations. For example, the input data to the operation described above with regard to block 62 may comprise one or more data files that are output by the operation described above with regard to block 10. As described above, such data files include information representing an image of pins of a partitioned logic blocks in the first floorplan. Likewise, the input data to the operation described above with regard to block 66 may comprise one or more data files that are output by the operation described above with regard to block 14. As described above, such data files include information representing an image of pins of the same partitioned logic block but in the second floorplan.

As further shown in FIG. 4, one or more data files 116 that represent all information associated with the first floorplan and one or more data files 118 that represent all information associated with the second floorplan can be temporarily stored in data storage 88. Similarly, one or more data files 120 representing the output or result of the comparison operation described above with regard to block 70 in FIG. 3B, i.e., representing differences between the images, can be temporarily stored in data storage 88.

More generally, any of the data sets (data files, databases, etc.) that define the input or output of any of the above-described operations can be temporarily stored in data storage 88. Furthermore, any of these data sets can be stored on removable data storage medium 94 or transmitted to a remote recipient via network connection 106. In this manner, in an embodiment in which some operations occur on one computer while other operations occur on another computer, such data sets can be conveyed between the computers. For example, after the above-described methods have been performed to determine differences between partitioned logic block interfaces of a partitioned logic block in two floorplans of an IC and compose a full-chip database that takes into account any such differences, the full-chip database (not shown) can be transmitted to an IC fabricator.

One or more illustrative or exemplary embodiments of the invention have been described above. However, it is to be understood that the invention is defined by the appended claims and is not limited to the specific embodiments described.

What is claimed is:

1. A method for determining differences between block interfaces of a partitioned logic block in two floorplans of an integrated circuit, comprising:
   providing a programmed processor system with one or more data files including first information representing an image of pins of the partitioned logic block in a first floorplan of an integrated circuit;
   providing a programmed processor system with one or more data files including second information representing an image of pins of the partitioned logic block in a second floorplan of the integrated circuit;
   the programmed processor system comparing the first information with the second information to determine differences between locations of the pins of the partitioned logic block in the first floorplan and the locations of the pins of the partitioned logic block in the second floorplan; and
   the programmed processor system processing one or more data files to substitute information representing the partitioned logic block in the second floorplan with information representing the partitioned logic block in the first floorplan if it is determined that no differences exist between locations of the pins of the partitioned logic block in the first floorplan and the locations of the pins of the partitioned logic block in the second floorplan.

2. The method of claim 1, wherein providing the programmed processor system with the first information comprises:
   identifying in a first input data file data representing pins of the partitioned logic block in the first floorplan of the integrated circuit; and
   forming a first modified data file having only the data from the first input data file representing pins of the partitioned logic block in the first floorplan of the integrated circuit.

3. The method of claim 2, further comprising converting the first modified data file to an image file format, wherein the programmed processor system comparing the first information with the second information comprises the programmed processor system comparing the first modified data file with another data file.

4. The method of claim 3, wherein providing the programmed processor system with the second information comprises:
   identifying in a second input data file data representing pins of the partitioned logic block in the second floorplan of the integrated circuit; and
   forming a second modified data file having only the data from the second input data file representing pins of the partitioned logic block in the second floorplan of the integrated circuit.

5. The method of claim 4, further comprising converting the second modified data file to an image file format, wherein the programmed processor system comparing the first information with the second information comprises the programmed processor system comparing the first modified data file with the second modified data file.

6. The method of claim 5, wherein the programmed processor system comparing the first modified data file with the second modified data file comprises the programmed processor system performing an exclusive-OR operation between the first modified data file and the second modified data file.

7. A system for determining differences between block interfaces of a partitioned logic block in two floorplans of an integrated circuit, comprising:
   a user interface;
   a memory subsystem storing first information representing an image of pins of the partitioned logic block in a first floorplan of an integrated circuit and second information representing an image of pins of the partitioned logic block in a second floorplan of the integrated circuit;
   a processor system, the processor system programmed to:
      compare the first information with the second information to determine differences between locations of the pins of the partitioned logic block in the first floorplan and the locations of the pins of the partitioned logic block in the second floorplan; and
      process one or more data files to substitute information representing the partitioned logic block in the second floorplan with information representing the partitioned logic block in the first floorplan if it is determined that no differences exist between locations of the pins of the partitioned logic block in the first floorplan and the locations of the pins of the partitioned logic block in the second floorplan.

8. The system of claim 7, wherein the processor system is further programmed to:
   identify in a first input data file data representing pins of the partitioned logic block in the first floorplan of the integrated circuit; and
   form a first modified data file having only the data from the first input data file representing pins of the partitioned logic block in the first floorplan of the integrated circuit.

9. The system of claim 8, wherein the processor system is further programmed to convert the first modified data file to an image file format, wherein the programmed processor system compares the first information with the second information by comparing the first modified data file with another data file.

10. The system of claim 9, wherein the processor system is further programmed to:
   identify in a second input data file data representing pins of the partitioned logic block in the second floorplan of the integrated circuit; and
   form a second modified data file having only the data from the second input data file representing pins of the partitioned logic block in the second floorplan of the integrated circuit.

11. The system of claim 10, the processor system is further programmed to convert the second modified data file to an image file format, wherein the programmed processor system compares the first information with the second information by comparing the first modified data file with the second modified data file.

12. The system of claim 11, wherein the processor system is programmed to compare the first modified data file with the second modified data file by performing an exclusive-OR operation between the first modified data file and the second modified data file.

13. A computer program product for determining differences between block interfaces of a partitioned logic block in two floorplans of an integrated circuit, the computer program product comprising a non-transitory computer-usable medium on which is stored in computer-executable form instructions for causing a computer system to effect a method comprising:
- providing first information representing an image of pins of the partitioned logic block in a first floorplan of an integrated circuit;
- providing second information representing an image of pins of the partitioned logic block in a second floorplan of the integrated circuit;
- comparing the first information with the second information to determine differences between locations of the pins of the partitioned logic block in the first floorplan and the locations of the pins of the partitioned logic block in the second floorplan; and
- substituting information representing the partitioned logic block in the second floorplan with information representing the partitioned logic block in the first floorplan if it is determined that no differences exist between locations of the pins of the partitioned logic block in the first floorplan and the locations of the pins of the partitioned logic block in the second floorplan.

14. The computer program product of claim 13, wherein providing the first information comprises:
- identifying in a first input data file data representing pins of the partitioned logic block in the first floorplan of the integrated circuit; and
- forming a first modified data file having only the data from the first input data file representing pins of the partitioned logic block in the first floorplan of the integrated circuit.

15. The computer program product of claim 14, further comprising instructions for causing the computer system to convert the first modified data file to an image file format, wherein comparing the first information with the second information by comparing the first modified data file with another data file.

16. The computer program product of claim 15, wherein providing the second information comprises:
- identifying in a second input data file data representing pins of the partitioned logic block in the second floorplan of the integrated circuit; and
- forming a second modified data file having only the data from the second input data file representing pins of the partitioned logic block in the second floorplan of the integrated circuit.

17. The computer program product of claim 16, further comprising further comprising instructions for causing the computer system to convert the second modified data file to an image file format, wherein comparing the first information with the second information comprises comparing the first modified data file with the second modified data file.

18. The computer program product of claim 17, wherein comparing the first modified data file with the second modified data file comprises performing an exclusive-OR operation between the first modified data file and the second modified data file.

* * * * *